(12) United States Patent
Kang et al.

(10) Patent No.: US 11,721,620 B2
(45) Date of Patent: Aug. 8, 2023

(54) FAN-OUT TYPE SEMICONDUCTOR PACKAGE

(71) Applicant: SAMSUNG ELECTRONICS CO., LTD., Suwon-si (KR)

(72) Inventors: Myungsam Kang, Hwaseong-si (KR); Youngchan Ko, Seoul (KR); Jeongseok Kim, Cheonan-si (KR); Bongju Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/218,356

(22) Filed: Mar. 31, 2021

(65) Prior Publication Data

US 2022/0068784 A1    Mar. 3, 2022

(30) Foreign Application Priority Data

Aug. 27, 2020   (KR) ................. 10-2020-0108516

(51) Int. Cl.
*H01L 23/552*    (2006.01)
*H01L 23/498*    (2006.01)
*H01L 25/10*    (2006.01)
*H01L 23/00*    (2006.01)

(52) U.S. Cl.
CPC .. *H01L 23/49838* (2013.01); *H01L 23/49816* (2013.01); *H01L 23/49822* (2013.01); *H01L 23/552* (2013.01); *H01L 25/105* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73204* (2013.01)

(58) Field of Classification Search
CPC .... H01L 23/552; H01L 23/5389; H01L 23/60
See application file for complete search history.

(56) References Cited

U.S. PATENT DOCUMENTS

| | | | |
|---|---|---|---|
| 7,109,410 B2 | 9/2006 | Arnold et al. |
| 7,381,906 B2 | 6/2008 | Holmberg |
| 7,518,067 B2 | 4/2009 | Gupta et al. |
| 8,536,663 B1 | 9/2013 | Kuo et al. |
| 8,581,419 B2 | 11/2013 | Su et al. |
| 8,729,679 B1 | 5/2014 | Phua |

(Continued)

*Primary Examiner* — Michele Fan
(74) *Attorney, Agent, or Firm* — F. Chau & Associates, LLC (57) ABSTRACT

A fan-out type semiconductor package includes: a frame including a cavity and a middle redistribution layer (RDL) structure at least partially surrounding the cavity; a semiconductor chip in the cavity; a lower RDL structure on the frame and electrically connected with the semiconductor chip and the middle RDL structure; an upper RDL structure on the frame and electrically connected with the middle RDL structure; an upper shielding pattern in the upper RDL structure to shield the semiconductor chip from electromagnetic interference (EMI); a lower shielding pattern in the lower RDL structure to shield the semiconductor chip from the EMI; and a side shielding pattern in the middle RDL structure to shield the semiconductor chip from the EMI. The upper shielding pattern and the lower shielding pattern have a thickness of no less than about 5 μm, and the side shielding pattern has a width of no less than about 5 μm.

19 Claims, 8 Drawing Sheets

(56) References Cited

U.S. PATENT DOCUMENTS

| | | |
|---|---|---|
| 8,861,221 B2 | 10/2014 | Pagaila |
| 9,337,073 B2 | 5/2016 | Liu et al. |
| 2004/0264156 A1* | 12/2004 | Ajioka ................. H01L 23/552 257/E25.031 |
| 2008/0315375 A1* | 12/2008 | Eichelberger ........ H05K 1/0206 257/659 |
| 2011/0266041 A1* | 11/2011 | Tuominen ............... H01L 24/24 174/260 |
| 2014/0048914 A1* | 2/2014 | Lin ........................ H01L 24/19 257/659 |
| 2014/0252595 A1* | 9/2014 | Yen ...................... H01L 23/498 257/737 |
| 2014/0367160 A1* | 12/2014 | Yu ....................... H01L 21/7684 174/377 |
| 2015/0016078 A1* | 1/2015 | Yang ....................... C23C 28/40 156/150 |
| 2017/0110413 A1* | 4/2017 | Chen .................. H01L 23/3107 |
| 2017/0162516 A1* | 6/2017 | Joh ....................... H01L 23/552 |
| 2018/0026010 A1* | 1/2018 | Huang ................ H01L 23/5386 257/659 |
| 2018/0138029 A1* | 5/2018 | Kim .................. H01L 21/76841 |
| 2018/0269186 A1* | 9/2018 | Kang .................. H01L 23/5389 |
| 2019/0122993 A1* | 4/2019 | Kim ...................... H01L 23/585 |

* cited by examiner

FAN-OUT TYPE SEMICONDUCTOR PACKAGE

CROSS-REFERENCE TO RELATED APPLICATION

This application claims priority under 35 USC § 119 to Korean Patent Application No. 10-2020-0108516, filed on Aug. 27, 2020 in the Korean Intellectual Property Office (KIPO), the disclosure of which is incorporated by reference herein in its entirety.

TECHNICAL FIELD

Exemplary embodiments of the present inventive concept relate to a fan-out type semiconductor package. More particularly, exemplary embodiments of the present inventive concept relate to a fan-out type semiconductor package including a redistribution layer.

DISCUSSION OF THE RELATED ART

Generally, a fan-out type semiconductor package may include a frame including a cavity and a middle redistribution layer (RDL) structure. The fan-out type semiconductor package may further include a semiconductor chip arranged in the cavity, a lower RDL structure arranged under the frame, and an upper RDL structure arranged over the frame.

In addition, the fan-out type semiconductor package may not include a structure configured to shield the semiconductor chip from electromagnetic interference (EMI).

SUMMARY

According to an exemplary embodiment of the present inventive concept, a fan-out type semiconductor package includes: a frame including a cavity and a middle redistribution layer (RDL) structure configured to at least partially surround the cavity; a semiconductor chip arranged in the cavity; a lower RDL structure arranged on the frame and electrically connected with the semiconductor chip and the middle RDL structure; an upper RDL structure arranged on the frame and electrically connected with the middle RDL structure; an upper shielding pattern arranged in the upper RDL structure to shield the semiconductor chip from electromagnetic interference (EMI); a lower shielding pattern arranged in the lower RDL structure to shield the semiconductor chip from the EMI; and a side shielding pattern arranged in the middle RDL structure to shield the semiconductor chip from the EMI, wherein the upper shielding pattern and the lower shielding pattern have a thickness of no less than about 5 μm, and the side shielding pattern has a width of no less than about 5 μm.

According to an exemplary embodiment of the present inventive concept, a fan-out type semiconductor package includes: a frame including a cavity and a middle redistribution layer (RDL) structure configured to at least partially surround the cavity; a semiconductor chip arranged in the cavity; a lower RDL structure arranged on the frame and electrically connected with the semiconductor chip and the middle RDL structure; an upper RDL structure arranged on the frame and electrically connected with the middle RDL structure; a first shielding pattern arranged in the upper RDL structure to shield a first portion of the semiconductor chip from an electromagnetic interference (EMI); a second shielding pattern arranged in the lower RDL structure to shield a second portion of the semiconductor chip from the EMI; and a third shielding pattern arranged in the middle RDL structure to shield a third portion of the semiconductor chip from the EMI.

According to an exemplary embodiment of the present inventive concept, a fan-out type semiconductor package including: a frame including a cavity and a middle redistribution layer (RDL) structure configured to at least partially surround the cavity; a semiconductor chip arranged in the cavity; a lower RDL structure arranged on the frame and electrically connected with the semiconductor chip and the middle RDL structure; an upper RDL structure arranged on the frame and electrically connected with the middle RDL structure; and a shielding pattern configured to cover at least one surface of the semiconductor chip to shield the semiconductor chip from an electromagnetic interference (EMI).

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be described in detail with reference to the accompanying drawings.

Figure 1:
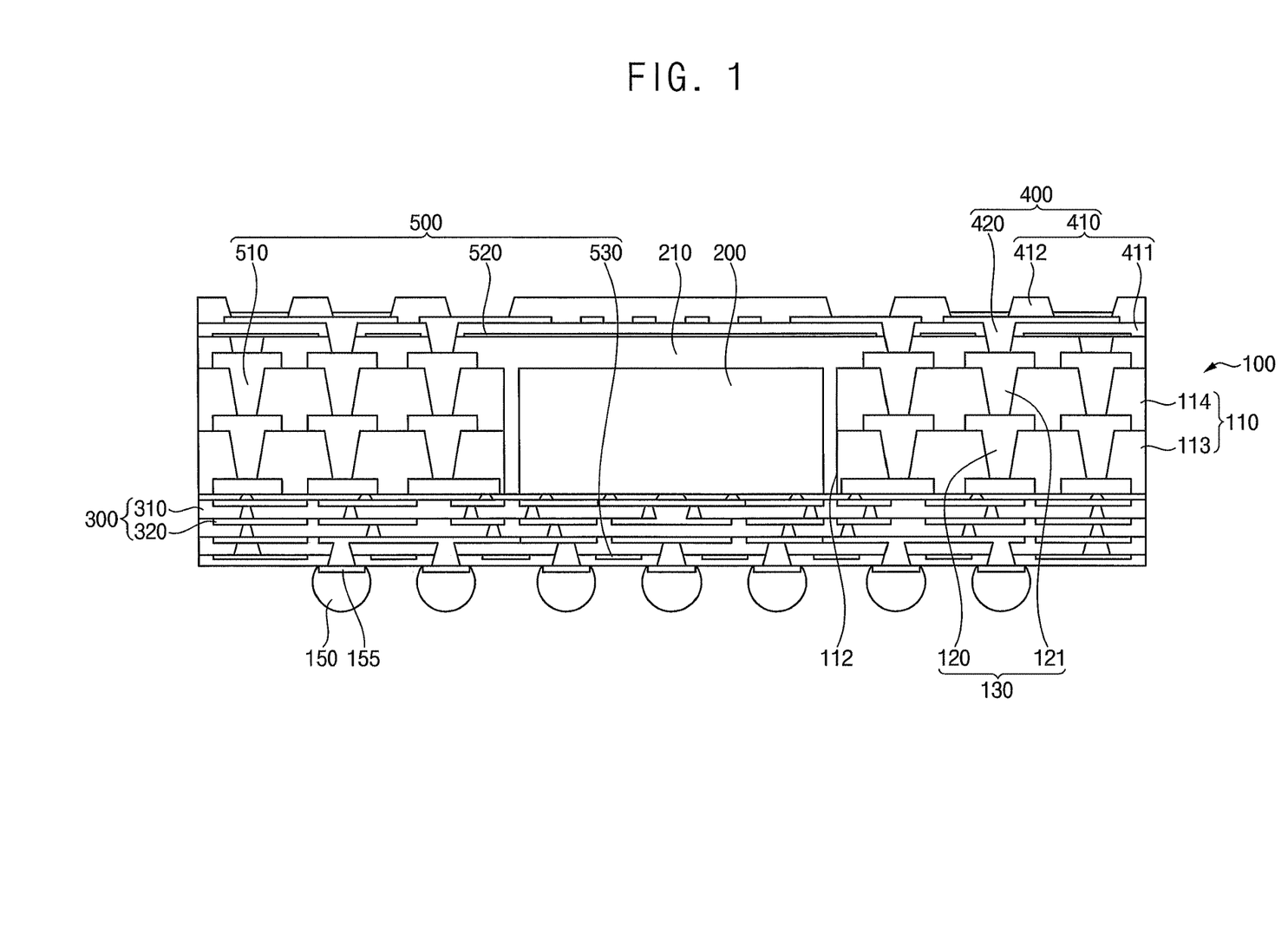
FIG. 1 is a cross-sectional view illustrating a fan-out type semiconductor package in accordance with an exemplary embodiment of the present inventive concept.

FIG. 1 is a cross-sectional view illustrating a fan-out type semiconductor package in accordance with an exemplary embodiment of the present inventive concept.

Referring to FIG. 1, a fan-out type semiconductor package may include a frame 100, a semiconductor chip 200, a lower redistribution layer (RDL) structure 300, an upper RDL structure 400 and a shielding pattern 500.

The frame 100 may include an insulation substrate 110 and a middle RDL structure 130. The insulation substrate 110 may include a cavity 112. The cavity 112 may penetrate the insulation substrate 110. For example, the cavity 112 may be vertically formed through a central portion of the insulation substrate 110. The middle RDL structure 130 may be formed in the insulation substrate 110.

The insulation substrate 110 may include a plurality of stacked middle insulation layers 113 and 114. In an exemplary embodiment of the present inventive concept, the insulation substrate 110 may include stacked first and second middle insulation layers 113 and 114. However, the present inventive concept is not limited thereto. The first middle insulation layer 113 may have an opening vertically formed through the first middle insulation layer 113. The second middle insulation layer 114 may be formed on an upper surface of the first middle insulation layer 113. The second middle insulation layer 114 may have an opening vertically formed through the second middle insulation layer 114. The first and second middle insulation layers 113 and 114 may include, for example, a photoimageable dielectric (PID) material. In addition, the first and second middle insulation layers 113 and 114 may include other insulation materials. Further, the first and second middle insulation layers 113 and 114 may have substantially the same thickness as each other or different thicknesses from each other.

The middle RDL structure 130 may include a plurality of middle RDLs 120 and 121 may be respectively arranged in the middle insulation layers 113 and 114. In an exemplary embodiment of the present inventive concept, the middle RDL structure 130 may include a first middle RDL 120 and a second middle RDL 121. The first middle RDL 120 may be formed on the first middle insulation layer 113. For example, the first middle RDL 120 may be formed on an upper surface and/or a lower surface of the first middle insulation layer 113. The second middle RDL 121 may be formed on the first middle RDL 120 and an upper surface of second middle insulation layer 114. For example, the second middle RDL 121 may overlap an upper surface of the first middle insulation layer 113. The opening of the first middle insulation layer 113 may be filled with a first contact. For example, the first contact may be used to form the first middle RDL 120 in the first middle insulation layer 113. The opening of the second middle insulation layer 114 may be filled with a second contact. For example, the second contact may be used to form the second middle RDL 121. For example, the second contact may be disposed on the first contact. As an additional example, the first middle RDL 120 may be electrically connected with the second middle RDL 121. For example, an upper surface of the second contact may be upwardly exposed on an upper surface of the second middle insulation layer 114.

In addition, the insulation substrate 110 may include a single insulation layer. In this case, a single middle RDL 120 may be exposed through an upper surface of the single insulation substrate 110. Further, the insulation substrate 110 may include, for example, at least three insulation layers.

The semiconductor chip 200 may be arranged in the cavity 112 of the insulation substrate 110. The semiconductor chip 200 may include a plurality of pads. The pads may be arranged on a lower surface of the semiconductor chip 200.

A molding member 210 may be configured to cover the semiconductor chip 200. In an exemplary embodiment of the present inventive concept, the molding member 210 may be formed on an upper surface of the insulation substrate 110 to fill a space between the semiconductor chip 200 and an inner surface of the cavity 112.

The lower RDL structure 300 may be arranged under the frame 100. The lower RDL structure 300 may include a plurality of stacked lower insulation layers 310 and a plurality of lower RDLs 320.

In an exemplary embodiment of the present inventive concept, the lower insulation layers 310 may include, for example, a first lower insulation layer, a second lower insulation layer, a third lower insulation layer and a fourth lower insulation layer. The first to fourth lower insulation layers may include the PID. In addition, the first to fourth lower insulation layers may include other insulation layers. The first to fourth lower insulation layers may have substantially the same thickness as each other or different thicknesses from each other.

The lower RDLs 320 may be arranged between the lower insulation layers 310. In an exemplary embodiment of the present inventive concept, the lower RDLs 320 may include, for example, a first lower RDL, a second lower RDL and a third lower RDL. The first to third lower RDLs may include a metal such as copper, aluminum, etc. However, the material of the first to third lower RDLs may not be restricted within a specific conductive material. Further, the first to third lower RDLs may have substantially the same thickness as each other or different thicknesses from each other.

In addition, the lower RDL structure 300 may include stacked three or at least five lower insulation layers 310 and lower RDLs 320 arranged between the lower insulation layers 310.

The first lower insulation layer may include a plurality of first via holes. The first via holes may be formed in the first lower insulation layer. For example, the first via holes may completely penetrate the first lower insulation layer. A lower solder resist pattern may be formed on a lower surface of the first lower insulation layer. External terminals 150 such as solder balls may be mounted on the lower surface of the first lower insulation layer.

The first lower RDL may be arranged on an upper surface of the first lower insulation layer. The first lower RDL may include first via contacts configured to fill the first via holes in the first lower insulation layer. For example, the first lower RDL and the first via contacts may be formed by forming a conductive layer on the upper surface of the first lower insulation layer and inner surfaces of the first via holes by a plating process on a seed layer, and by patterning the conductive layer. The first via contacts may be exposed through openings of the lower solder resist pattern. The external terminals 150 may be electrically connected to the exposed first via contacts. An under bump metal (UBM) 155 may be interposed between the external terminal 150 and the first via contact.

The second lower insulation layer may be arranged on the upper surface of the first lower insulation layer. The second lower insulation layer may include a plurality of second via holes. The second via holes may be formed in the second lower insulation layer to expose the first lower RDL.

The second lower RDL may be arranged on an upper surface of the second lower insulation layer. The second lower RDL may include second via contacts configured to fill the second via holes in the second lower insulation layer. For example, the second lower RDL and the second via contacts may be formed by forming a conductive layer on the upper surface of the second lower insulation layer and inner surfaces of the second via holes by a plating process on a seed layer, and by patterning the conductive layer. Thus, the first lower RDL and the second lower RDL may be electrically connected with each other via the second via contacts.

The third lower insulation layer may be arranged on the upper surface of the second lower insulation layer. The third lower insulation layer may include a plurality of third via holes. The third via holes may be formed in the third lower insulation layer to expose the second lower RDL.

The third lower RDL may be arranged on an upper surface of the third lower insulation layer. The third lower RDL may include third via contacts configured to fill the third via holes. For example, the third lower RDL and the third via contacts may be formed by forming a conductive layer on the upper surface of the third lower insulation layer and inner surfaces of the third via holes by a plating process on a seed layer, and by patterning the conductive layer. Thus, the second lower RDL and the third lower RDL may be electrically connected with each other via the third via contacts.

The upper RDL structure 400 may be arranged over the frame 100. The upper RDL structure 400 may include a plurality of stacked upper insulation layers 410 and a plurality of upper RDLs 420.

The upper insulation layers 410 may be arranged on the upper surface of the molding member 210. In an exemplary embodiment of the present inventive concept, the upper insulation layers 410 may include the PID. In addition, the upper insulation layers 410 may include other insulation materials.

For example, the upper insulation layers 410 may include a first upper insulation layer 411 and a second upper insulation layer 412. The first upper insulation 411 layer may be formed on the molding member 210. For example, the first upper insulation layer 411 may be formed on the upper surface of the molding member 210. The first upper insulation layer 411 may have an opening configured to expose a middle RDL of the plurality of middle RDL 120 and 121, for example, the second middle RDL 121.

The upper RDLs 420 may be formed on an upper surface of the first upper insulation layer 411 to fill the opening of the first upper insulation layer 411. Thus, the upper RDLs 420 may be electrically connected with the middle RDLs 120 and 121, for example, the second middle RDL 121.

The second upper insulation layer 412 may be formed on the upper surface of the first upper insulation layer 411. The second upper insulation layer 412 may have an opening configured to expose the upper RDL 420.

The shielding pattern 500 may protect the semiconductor chip 200 from electromagnetic interference (EMI). For example, the shielding pattern 500 may shield the semiconductor chip 200 from transmitted EMI. The shielding pattern 500 may be configured to cover at least one surface of the semiconductor chip 200. For example, the shielding pattern 500 may at least partially surround the semiconductor chip 200. The shielding pattern 500 may be electrically connected to a ground terminal of the fan-out type semiconductor package. The shielding pattern 500 may include a metal such as copper. In an exemplary embodiment of the present inventive concept, the shielding pattern 500 may include a side shielding pattern 510, an upper shielding pattern 520 and a lower shielding pattern 530.

The side shielding pattern 510 may be configured to surround side surfaces of the semiconductor chip 200. Thus, the side shielding pattern 510 may shield the side surfaces of the semiconductor chip 200 from the EMI. The side shielding pattern 510 for effectively shielding the EMI may have a width of no less than about 5 μm. However, the width of the side shielding pattern 510 may be less than about 5 μm.

The side shielding pattern 510 may be arranged in the insulation substrate 110. For example, the side shielding pattern 510 may be vertically arranged in the middle insulation layer 114. For example, the side shielding pattern 510 may be arranged outside the middle RDLs 120 and 121. For example, the side shielding pattern 510 may at least partially surround the middle RDLs 120 and 121.

Figure 2:
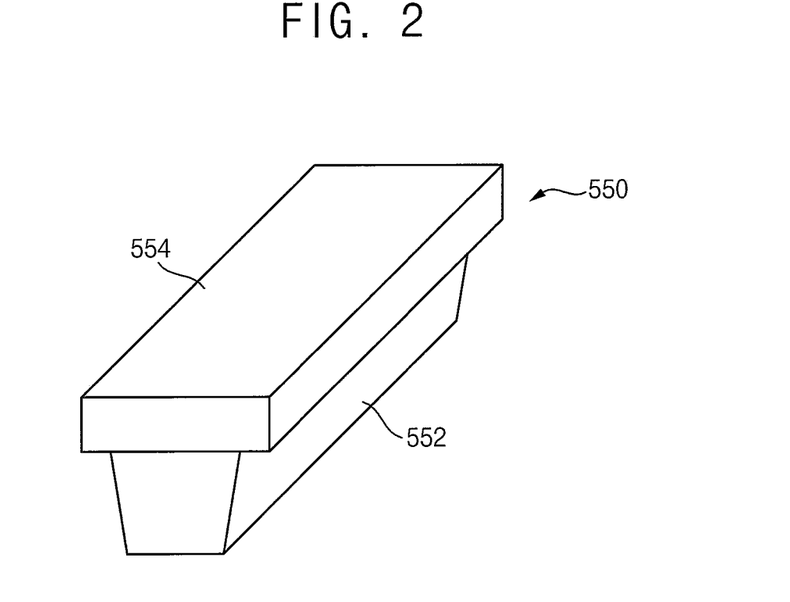
FIGS. 2 and 3 are perspective views illustrating side shielding patterns of the fan-out type semiconductor package in FIG. 1.
Figure 3:
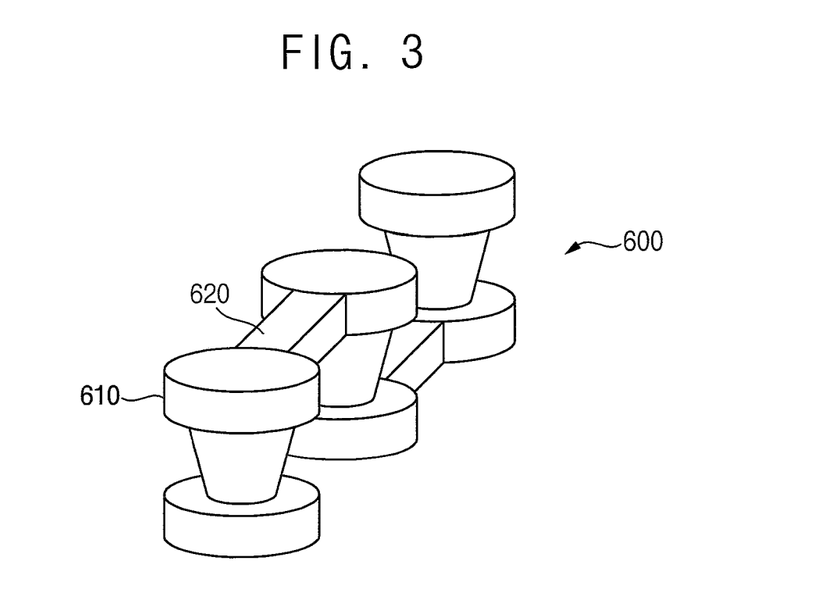

FIGS. 2 and 3 are perspective views illustrating side shielding patterns of the fan-out type semiconductor package in FIG. 1.

Referring to FIG. 2, a side shielding pattern 550 may have a trench via shape. For example, the side shielding pattern 550 may include a lower pattern 552 configured to fill a trench of the middle insulation layer 114, and an upper pattern 554 arranged on an upper surface of the lower pattern 552. A plurality of the side shielding patterns 510 may be stacked in accordance with numbers of the insulation layers 113 and 114.

A shape of the lower pattern 552 may be determined in accordance with a shape of the corresponding trench formed in either the first middle insulation layer 114 or the second middle insulation layer 114. In an exemplary embodiment of the present inventive concept, the trench may have gradually increased widths from a lower end to an upper end in the trench so that the lower pattern 552 may have a trapezoidal cross-sectional shape having a lower width and an upper width greater than the lower width.

The upper pattern 554 may have, for example, a cuboid shape. However, the upper pattern 554 may have other shapes besides the cuboid shape.

Referring to FIG. 3, a side shielding pattern 600 may have a stitch via shape. For example, the stitch via shape may have a plurality of conductors 610 connected with each other via connections 620. For example, each of the conductors 610 may have a cylindrical shape.

Referring again to FIG. 1, the lower shielding pattern 530 may be configured to overlap a lower portion of the semiconductor chip 200. For example, the lower shielding pattern 530 may at least partially surround the lower portion of the semiconductor chip 200. Thus, the lower shielding pattern 530 may shield a lower surface of the semiconductor chip 200 from the EMI. The lower shielding pattern 530 for effectively blocking the EMI may have a thickness of no less than about 5 μm. However, the present inventive concept may not be limited thereto.

For example, the thickness of the lower shielding pattern 530 may be less than about 5 μm.

The lower shielding pattern 530 may be arranged in the lower RDL structure 300. For example, the lower shielding pattern 530 may be horizontally arranged in the lower insulation layer 310. For example, the lower shielding pattern 530 may be arranged in the first lower insulation layer corresponding to a lowermost layer of the lower insulation layers 310.

The upper shielding pattern 520 may be configured to overlap an upper portion of the semiconductor chip 200. For example, the upper shielding pattern 520 may at least partially surround an upper portion of the semiconductor chip 200. Thus, the upper shielding pattern 520 may shield an upper surface of the semiconductor chip 200 from the EMI. The upper shielding pattern 520 for effectively blocking the EMI may have a thickness of no less than about 5 μm. However, the present inventive concept is not limited thereto. For example, the thickness of the upper shielding pattern 520 may be less than about 5 μm.

The upper shielding pattern 520 may be arranged in the upper RDL structure 400. For example, the upper shielding pattern 520 may be horizontally arranged in the upper insulation layer 410. For example, the upper shielding pattern 520 may be arranged in the first upper insulation layer 411 of the upper insulation layers 410.

The upper shielding pattern 520 may have a shape substantially the same as that of the lower shielding pattern 530. Hereinafter, various shapes of the upper shielding pattern 520 may be illustrated in detail. In addition, the shape of the upper shielding pattern 520 may be different from the shape of the lower shielding pattern 530.

Figure 4:
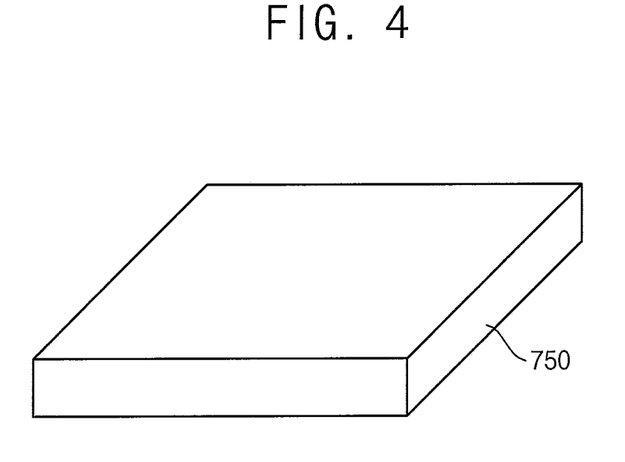
FIGS. 4, 5 and 6 are perspective views illustrating upper shielding patterns of the fan-out type semiconductor package in FIG. 1.
Figure 5:
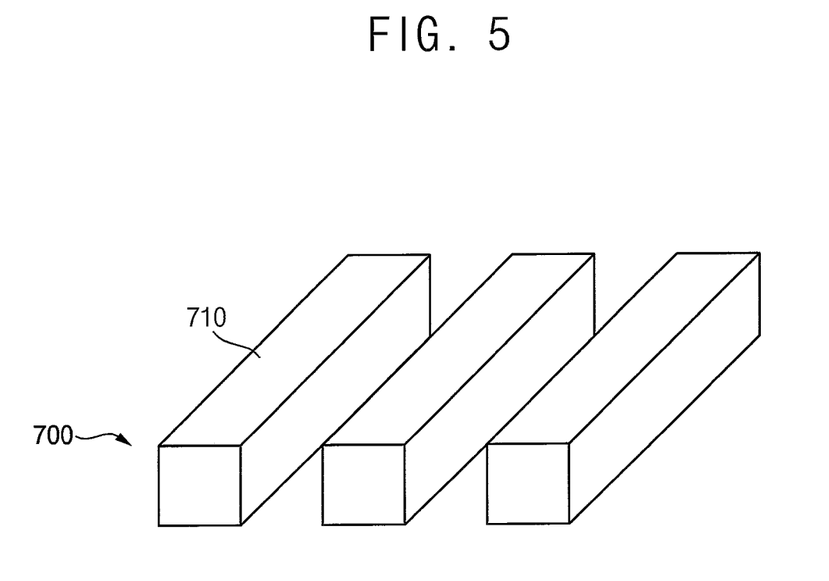
Figure 6:
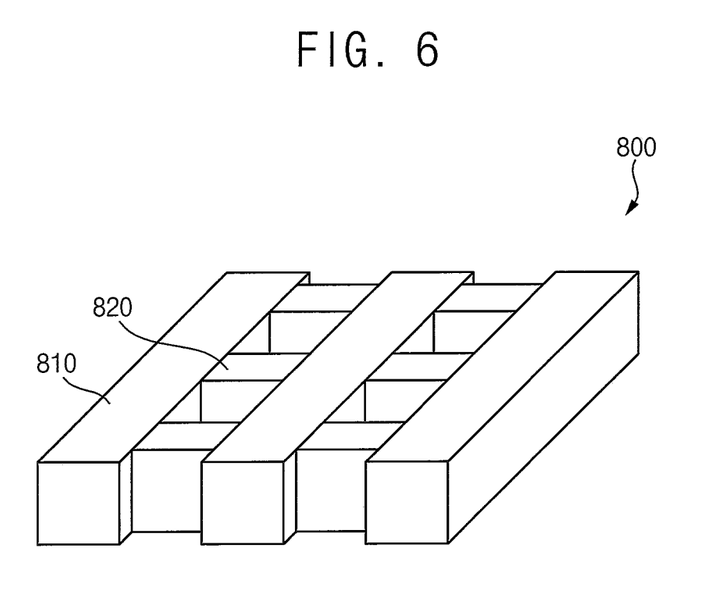

FIGS. 4 to 6 are perspective views illustrating upper shielding patterns of the fan-out type semiconductor package in FIG. 1.

Referring to FIG. 4, an upper shielding pattern 750 may have, for example, a cuboid shape. Thus, the cuboid-shaped upper shielding pattern 750 may be configured to cover the upper surface of the semiconductor chip 200. For example, the upper shielding pattern 750 may cover the whole upper surface of the semiconductor chip 200. Similarly, a cuboid-shaped lower shielding pattern 750 may also cover the lower surface of the semiconductor chip 200. For example, the lower shielding pattern 750 may cover the whole lower surface of the semiconductor chip 200.

Referring to FIG. 6, an upper shielding pattern 700 may have a plurality of bars 710 each having, for example, a cuboid or rectangular prism shape. The plurality of the bars 710 may be arranged to be parallel with each other.

Referring to FIG. 6, an upper shielding pattern 800 may have a grid shape. For example, the upper shielding pattern 800 may include a plurality of first bars 810 arranged parallelly with each other, and a plurality of second bars 820 arranged in a direction substantially perpendicular to an extending direction of the first bars 820. For example, the upper shielding pattern 800 may have a hash shape or grid shape in which the first bars 810 and the second bars 820 intersect each other along the orthogonal directions.

Figure 7:
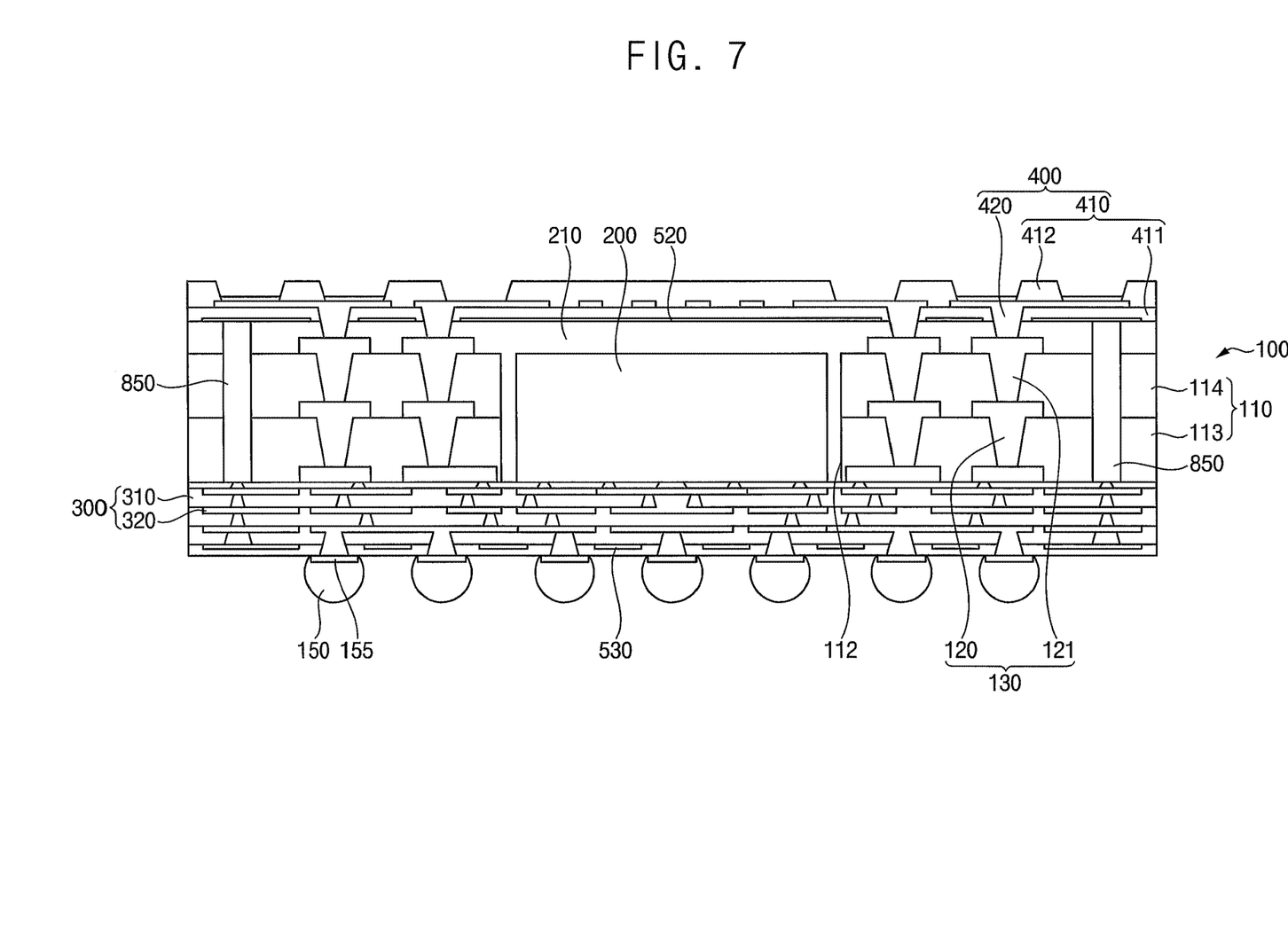
FIG. 7 is a cross-sectional view illustrating a fan-out type semiconductor package in accordance with an exemplary embodiment of the present inventive concept.
Figure 8:
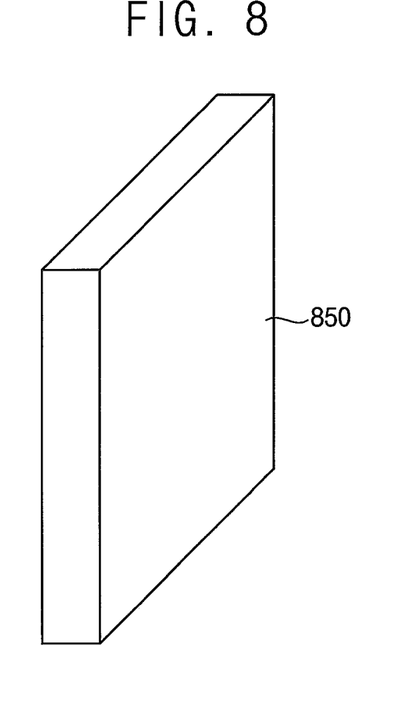
FIG. 8 is a perspective view illustrating a side shielding pattern of the fan-out type semiconductor package in FIG. 7.

FIG. 7 is a cross-sectional view illustrating a fan-out type semiconductor package in accordance with an exemplary embodiment of the present inventive concept. FIG. 8 is a perspective view illustrating a side shielding pattern of the fan-out type semiconductor package in FIG. 7, and FIG. 9 is a cross-sectional view illustrating the side shielding pattern in FIG. 8 arranged in the fan-out type semiconductor package in FIG. 7.

A fan-out type semiconductor package of this embodiment may include elements substantially the same as those of the fan-out type semiconductor package in FIG. 1 except for a shape of a side shielding pattern. Thus, the same reference numerals may refer to the same elements and any further illustrations with respect to the same elements may be omitted herein for brevity.

Figure 9:
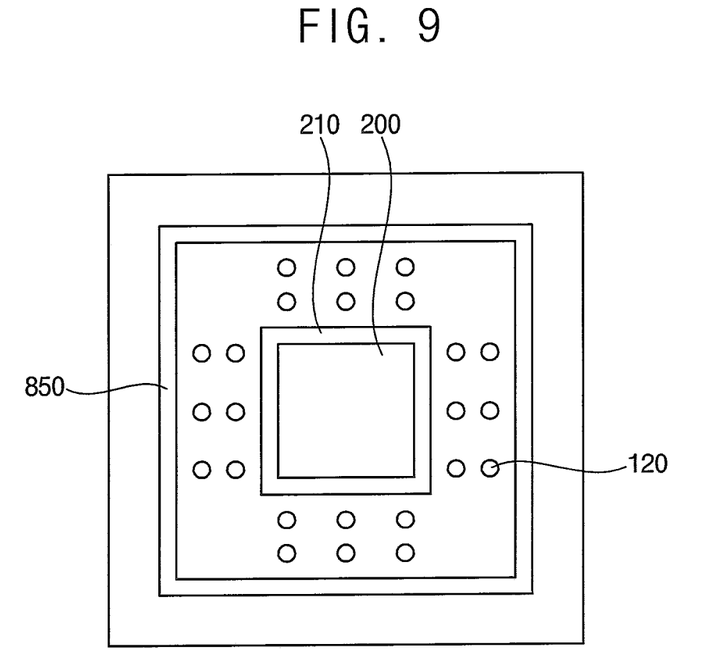
FIG. 9 is a cross-sectional view illustrating the side shielding pattern in FIG. 8 arranged in the fan-out type semiconductor package in FIG. 7.

Referring to FIGS. 7 to 9, a side shielding pattern 850 may have, for example, a plate shape or a cuboid shape. The side shielding pattern 850 may be configured to surround the four side surfaces of the semiconductor chip 200 so that the side shielding pattern 850 may have a rectangular frame shape. As a result, the plate-shaped side shielding pattern 850 may form a wall structure configured to surround all side surfaces of the semiconductor chip 200.

Figure 10:
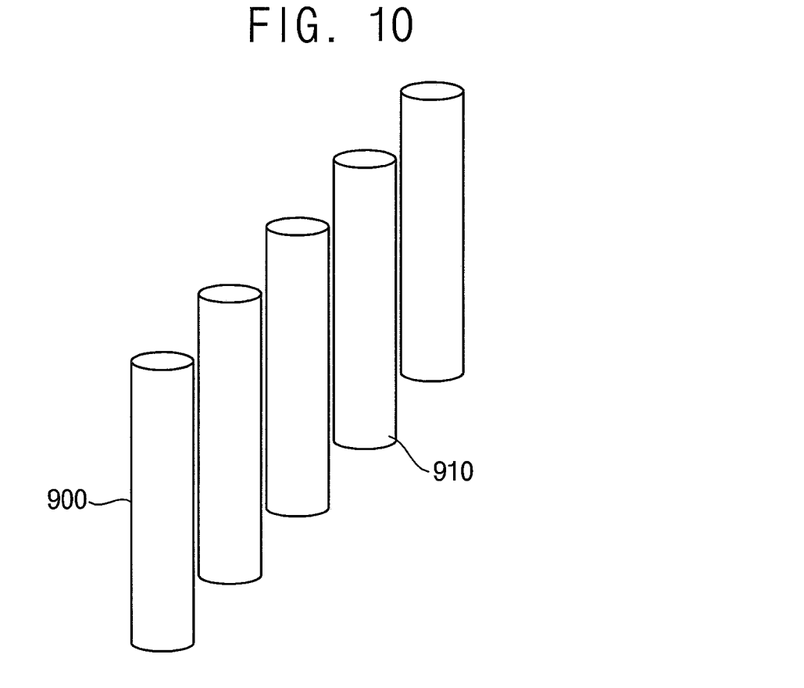
FIG. 10 is a perspective view illustrating a side shielding pattern of the fan-out type semiconductor package in FIG. 7.
Figure 11:
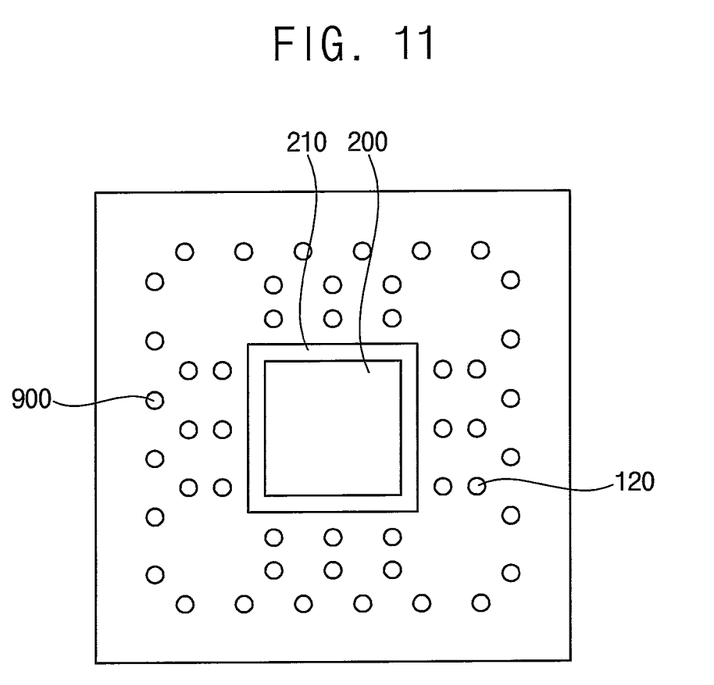
FIG. 11 is a cross-sectional view illustrating the side shielding pattern in FIG. 10 arranged in the fan-out type semiconductor package in FIG. 7.

FIG. 10 is a perspective view illustrating a side shielding pattern of the fan-out type semiconductor package in FIG. 7, and FIG. 11 is a cross-sectional view illustrating the side shielding pattern in FIG. 10 arranged in the fan-out type semiconductor package in FIG. 7.

Referring to FIGS. 10 and 11, a side shielding pattern 900 may have a plurality of pillars 910. For example, each of the pillars 910 may have a cylindrical shape or a cuboid shape. For example, the side shielding pattern 900 may include the plurality of pillars 910 arranged along the side surfaces of the semiconductor chips 200.

In addition, the shielding pattern 500 may include at least one of the upper shielding pattern 520, the lower shielding pattern 530, or the side shielding pattern 510.

Further, in an exemplary embodiment of the present inventive concept, the side shielding pattern 510, the upper shielding pattern 520 and the lower shielding pattern 530 may be electrically connected with each other. In this case, any one of the side shielding pattern 510, the upper shielding pattern 520 and the lower shielding pattern 530 may be connected to the ground terminal.

In addition, the side shielding pattern 510, the upper shielding pattern 520 and the lower shielding pattern 530 may be isolated from each other. In this case, all of the side shielding pattern 510, the upper shielding pattern 520 and the lower shielding pattern 530 may be connected to the ground terminal.

Figure 12:
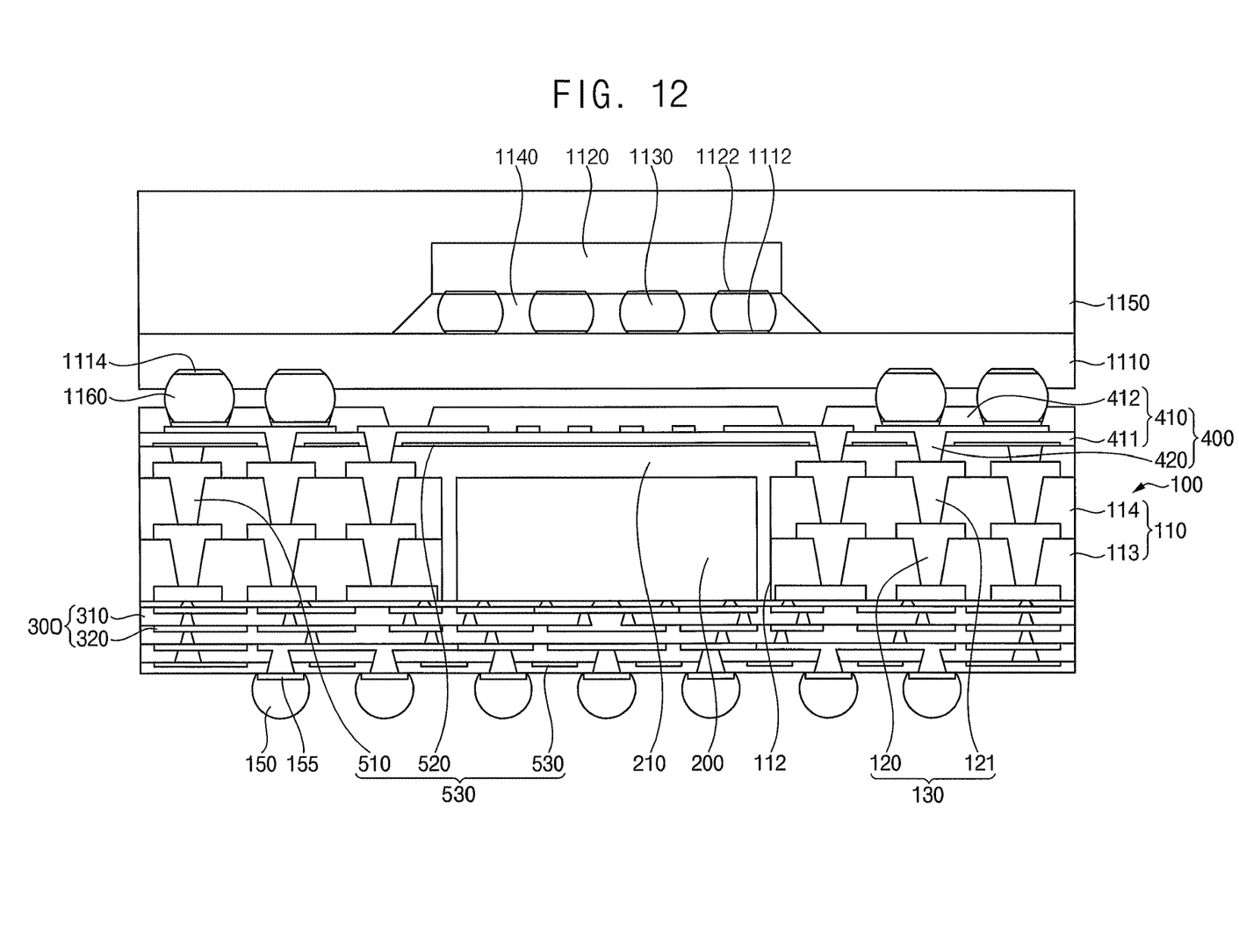
FIG. 12 is a cross-sectional view illustrating a fan-out type semiconductor package in accordance with an exemplary embodiment of the present inventive concept.

FIG. 12 is a cross-sectional view illustrating a fan-out type semiconductor package in accordance with an exemplary embodiment of the present inventive concept.

Referring to FIG. 12, a fan-out type semiconductor package may further include a second semiconductor package stacked on the fan-out type semiconductor package in FIG. 1. For example, the fan-out type semiconductor package of this embodiment may have a package-on-package (POP) structure.

The second semiconductor package may include a package substrate 1110, a second semiconductor chip 1120, conductive bumps 1130, an underfilling layer 1140 and a molding member 1150.

The package substrate 1110 may be electrically connected with the fan-out type semiconductor package in FIG. 1 via conductive bumps 1160 such as solder balls. For example, the conductive bumps 1160 may be mounted on the upper RDL 420 of the fan-out type semiconductor package in FIG. 1. A lower surface of the package substrate 1110 may be electrically connected with the upper RDL 420 of the fan-out type semiconductor package in FIG. 1 via the conductive bumps 1160.

The package substrate 1110 may include a plurality of lower pads 1114 and a plurality of upper pads 1112. The lower pads 1114 may be arranged on the lower surface of the package substrate 1110. The lower pads 1114 may make contact with the conductive bumps 1160. The upper pads 1112 may be arranged on an upper surface of the package substrate 1110.

The second semiconductor chip 1120 may be arranged on the upper surface of the package substrate 1110. The second semiconductor chip 1120 may include a plurality of pads 1122. The pads 1122 may be arranged on a lower surface of the second semiconductor chip 1120.

The conductive bumps 1130 may be interposed between the package substrate 1110 and the second semiconductor chip 1120. For example, the conductive bumps 1130 may electrically connect the upper pads 1112 of the package substrate 1110 and the pads 1122 of the second semiconductor chip 1120 to each other.

The underfilling layer 1140 may be interposed between the package substrate 1110 and the second semiconductor chip 1120 to at least partially surround the conductive bumps 1130. The underfilling layer 1140 may include an insulation material such as epoxy resin.

The molding member 1150 may be formed on the upper surface of the package substrate 1110 to cover the second semiconductor chip 1120. The molding member 1150 may include an epoxy molding compound (EMC).

In addition, the second semiconductor chip 1120 may be stacked on the fan-out type semiconductor package in FIG. 7.

According to an exemplary embodiment of the present inventive concept, the shielding pattern may surround the at least one of the surfaces of the semiconductor chip to shield the at least one surface of the semiconductor chip from the EMI. For example, the shielding pattern may include the upper shielding pattern configured to shield the upper portion of the semiconductor chip, the lower shielding pattern configured to shield the lower portion of the semiconductor chip, and the side shielding pattern configured to shield the side portion of the semiconductor chip so that surfaces of the semiconductor chip may be shielded from the EMI. Thus, a malfunction of the semiconductor chip caused by the EMI may be prevented.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A fan-out type semiconductor package comprising:
   a frame including a cavity and a middle redistribution layer (RDL) structure configured to at least partially surround the cavity;
   a semiconductor chip arranged in the cavity;
   a lower RDL structure arranged on the frame and electrically connected with the semiconductor chip and the middle RDL structure;
   an upper RDL structure arranged on the frame and electrically connected with the middle RDL structure;
   an upper shielding pattern arranged in the upper RDL structure to shield the semiconductor chip from electromagnetic interference (EMI);
   a lower shielding pattern arranged in the lower RDL structure to shield the semiconductor chip from the EMI; and
   a side shielding pattern arranged in the middle RDL structure to shield the semiconductor chip from the EMI,
   wherein the upper shielding pattern and the lower shielding pattern have a thickness of no less than about 5 μm, and the side shielding pattern has a width of no less than about 5 μm,
   wherein the side shielding pattern has a stitch via shape including a plurality of cylindrical conductors that are connected to each other by connectors extending along a side surface of the semiconductor chip.

2. The fan-out type semiconductor package of claim 1, wherein the upper shielding pattern and the lower shielding pattern have a cuboid shape or a grid shape.

3. The fan-out type semiconductor package of claim 1, wherein the upper shielding pattern, the lower shielding pattern and the side shielding pattern are electrically connected with each other.

4. The fan-out type semiconductor package of claim 1, wherein the middle RDL structure comprises:
   an insulation substrate having the cavity, wherein the cavity is formed in a central portion of the insulation substrate; and
   a middle RDL arranged in the insulation substrate,
   wherein the side shielding pattern is arranged in the insulation substrate to at least partially surround the middle RDL.

5. The fan-out type semiconductor package of claim 1, wherein the lower RDL, structure comprises:
   a plurality of stacked lower insulation layers; and
   a lower RDL arranged between the lower insulation layers,
   wherein the lower shielding pattern is arranged in at least one of the lower insulation layers.

6. The fan-out type semiconductor package of claim 1, wherein the upper RDL structure comprises:
   a plurality of stacked upper insulation layers; and
   an upper RDL arranged between the upper insulation layers,
   wherein the upper shielding pattern is arranged in at least one of the upper insulation layers.

7. A fan-out type semiconductor package comprising:
   a frame including a cavity and a middle redistribution layer (RDL) structure configured to at least partially surround the cavity;
   a semiconductor chip arranged in the cavity;
   a lower RDL structure arranged on the frame and electrically connected with the semiconductor chip and the middle RDL structure;
   an upper RDL structure arranged on the frame and electrically connected with the middle RDL structure;
   a first shielding pattern arranged in the upper RDL structure to shield a first portion of the semiconductor chip from an electromagnetic interference (EMI);
   a second shielding pattern arranged in the lower RDL structure to shield a second portion of the semiconductor chip from the EMI; and
   a third shielding pattern arranged in the middle RDL structure to shield a third portion of the semiconductor chip from the EMI,
   wherein the third shielding pattern has a stitch via shape including a plurality of cylindrical conductors that are connected to each other by connectors extending along a side surface of the semiconductor chip.

8. The fan-out type semiconductor package of claim 7, wherein the first shielding pattern and the second shielding pattern have a cuboid shape or a grid shape.

9. The fan-out type semiconductor package of claim 7, wherein the middle RDL structure comprises:
   an insulation substrate having the cavity, wherein the cavity is formed in a central portion of the insulation substrate; and
   a middle RDL arranged in the insulation substrate,
   wherein the third shielding pattern is arranged in the insulation substrate to at least partially surround the middle RDL.

10. The fan-out type semiconductor package of claim 7, wherein the lower RDL structure comprises:
    a plurality of stacked lower insulation layers; and
    a lower RDL arranged between the lower insulation layers,
    wherein the second shielding pattern is arranged in at least one of the lower insulation layers.

11. The fan-out type semiconductor package of claim 7, wherein the upper RDL structure comprises:
    a plurality of stacked upper insulation layers; and
    an upper RDL arranged between the upper insulation layers,
    wherein the first shielding pattern is arranged in at least one of the upper insulation layers.

12. A fan-out type semiconductor package comprising:
    a frame including a cavity and a middle redistribution layer (RDL) structure configured to at least partially surround the cavity;

a semiconductor chip arranged in the cavity;
a lower RDL structure arranged on the frame and electrically connected with the semiconductor chip and the middle RDL structure;
an upper RDL structure arranged on the frame and electrically connected with the middle RDL structure; and
a shielding pattern configured to cover at least one surface of the semiconductor chip to shield the semiconductor chip from an electromagnetic interference (EMI),
wherein the shielding pattern comprises a third shielding pattern extending along a side surface of the semiconductor chip, wherein the third shielding pattern includes a first via and a second via of a plurality of vias arranged along the side surface of the semiconductor chip, wherein the first via connects a first upper conductor to a first lower conductor, and the second via connects a second upper conductor to a second lower conductor, wherein a connector extending along the side surface of the semiconductor chip connects the first upper conductor to the second upper conductor and does not connect the first lower conductor to the second lower conductor.

13. The fan-out type semiconductor package of claim 12, wherein the shielding pattern comprises:
a first shielding pattern arranged in the upper RDL structure to shield a first portion of the semiconductor chip from the EMI; and
a second shielding pattern arranged in the lower RDL structure to shield a second portion of the semiconductor chip from the EMI,
wherein the third shielding pattern is arranged in the middle RDL structure to shield a third portion of the semiconductor chip from the EMI.

14. The fan-out type semiconductor package of claim 13, wherein the first shielding pattern and the second shielding pattern have a thickness of no less than about 5 µm, and the third shielding pattern has a width of no less than about 5 µm.

15. The fan-out type semiconductor package of claim 13, wherein the first shielding pattern and the second shielding pattern have a cuboid shape or a grid shape.

16. The fan-out type semiconductor package of claim 13, wherein the third shielding pattern has a trench via shape, a stitch via shape, a cylindrical shape or a cuboid shape.

17. The fan-out type semiconductor package of claim 13, wherein the middle RDL structure comprises:
an insulation substrate having the cavity, wherein the cavity is formed in a central portion of the insulation substrate; and
a middle RDL arranged in the insulation substrate,
wherein the third shielding pattern is arranged in the insulation substrate to at least partially surround the middle RDL.

18. The fan-out type semiconductor package of claim 13, wherein the lower RDL structure comprises:
a plurality of stacked lower insulation layers; and
a lower RDL arranged between the lower insulation layers,
wherein the second shielding pattern is arranged in at least one of the lower insulation layers.

19. The fan-out type semiconductor package of claim 13, wherein the upper RDL structure comprises:
a plurality of stacked upper insulation layers; and
an upper RDL arranged between the upper insulation layers,
wherein the first shielding pattern is arranged in at least one of the upper insulation layers.

\* \* \* \* \*